(12) United States Patent  
Kim

(10) Patent No.: US 9,077,283 B2  
(45) Date of Patent: Jul. 7, 2015

(54) SELF-OSCILLATION CIRCUIT HAVING MEANS FOR ELIMINATING QUADRATURE ERROR AND METHOD FOR ELIMINATING QUADRATURE ERROR USING THE CIRCUIT

(71) Applicant: Samsung Electro-Mechanics Co., Ltd., Suwon (KR)

(72) Inventor: Chang Hyun Kim, Yongin (KR)

(73) Assignee: SAMSUNG ELECTRO-MECHANICS CO., LTD., Suwon (KR)

(*) Notice: Subject to any disclaimer, the term of this patent is extended or adjusted under 35 U.S.C. 154(b) by 84 days.

(21) Appl. No.: 14/049,600

(22) Filed: Oct. 9, 2013

(65) Prior Publication Data

US 2014/0306773 A1    Oct. 16, 2014

(30) Foreign Application Priority Data

Apr. 12, 2013    (KR) .................. 10-2013-0040331

(51) Int. Cl.
| | |
|---|---|
| H03B 5/20 | (2006.01) |
| H03D 3/00 | (2006.01) |
| G01C 19/5776 | (2012.01) |

(52) U.S. Cl.
CPC ............ H03D 3/009 (2013.01); G01C 19/5776 (2013.01)

(58) Field of Classification Search
CPC ........... G01C 19/5726; G01C 19/5762; G01C 19/56; G01C 19/5755; G01C 19/5776; G01C 19/5719
USPC ................... 331/135, 78, 154; 73/503, 503.3, 73/504.01–504.18
See application file for complete search history.

(56) References Cited

U.S. PATENT DOCUMENTS

| 6,789,029 B2* | 9/2004 | Rober .............................. 702/76 |
| 7,464,590 B1* | 12/2008 | Hotelling et al. ........... 73/504.12 |
| 8,578,775 B2* | 11/2013 | Hayner et al. ............. 73/504.12 |
| 2013/0233074 A1* | 9/2013 | Durston et al. ............ 73/504.02 |

FOREIGN PATENT DOCUMENTS

| JP | 2008-241330 | 10/2008 |
| JP | 2011-12987 | 1/2011 |
| KR | 10-2006-0132686 | 12/2006 |
| KR | 10-2013-0112789 | 10/2013 |

OTHER PUBLICATIONS

Korean Office Action issued on Aug. 26, 2014 in corresponding Korean Patent Application No. 10-2013-0040331.

* cited by examiner

*Primary Examiner* — Lincoln Donovan  
*Assistant Examiner* — Diana J Cheng

(57) ABSTRACT

Disclosed herein are a self-oscillation circuit having a means for eliminating a quadrature error and a method for eliminating a quadrature error using the circuit. The self-oscillation circuit having a means for eliminating a quadrature error according to an exemplary embodiment of the present invention includes: a voltage converter converting a current signal from the gyroscope sensor into a voltage signal, a signal magnitude detector measuring a magnitude of a quadrature error signal included in an output signal from the voltage converter, and a quadrature error eliminator generating a signal which has the same phase as the output signal from the voltage converter and the same magnitude as a signal measured by the signal magnitude detector, based on an output signal from the signal magnitude detector and the output signal from the voltage converter.

9 Claims, 6 Drawing Sheets

FIG. 1   - PRIOR ART -

SELF-OSCILLATION CIRCUIT HAVING MEANS FOR ELIMINATING QUADRATURE ERROR AND METHOD FOR ELIMINATING QUADRATURE ERROR USING THE CIRCUIT

This application claims the benefit under 35 U.S.C. Section 119 of Korean Patent Application Serial No. 10-2013-0040331 entitled "Self-oscillation Circuit Having Means For Eliminating Quadrature Error And Method For Eliminating Quadrature Error Using The Circuit" filed on Apr. 12, 2013, which is hereby incorporated by reference in its entirety into this application.

BACKGROUND OF THE INVENTION

1. Technical Field

The present invention relates to a self-oscillation circuit having a means for eliminating a quadrature error and a method for eliminating a quadrature error using the circuit, and more particularly, to a self-oscillation circuit having a means for eliminating a quadrature error, which eliminates a quadrature error signal that occurs due to a mismatch caused by an asymmetrical shape of a gyroscope sensor to prevent a signal saturation and eliminate noises, and a method for eliminating a quadrature error using the circuit.

2. Description of the Related Art

A gyroscope is an apparatus which measures an angular velocity using a Coriolis force of a vibrating object. The Coriolis force depends on the following Equation 1.

$$F = 2 \, mV\Omega \qquad \text{[Equation 1]}$$

In the above Equation 1, F represents a Coriolis force, m represents a mass, V represents a velocity, and $\Omega$ represents an angular velocity.

The angular velocity $\Omega$ represented by $F/2 \, mV$ may be obtained by measuring the F when a constant velocity V is imposed on an object. In order for an object to obtain the constant velocity V, a vibration type gyroscope uses a feedback system which is self-oscillated. The self-oscillation happens under the condition in which the phase of the feedback loop becomes 180° and an open loop gain is larger than 1. When a driving signal of a resonance frequency is applied to the gyroscope sensor, an output phase of the sensor is shifted by 90° and output. Therefore, in order for the gyroscope sensor to perform the self-oscillation, when the gyroscope sensor uses a phase shifter to delay a phase by 90°, a phase is shifted by 180° in total, such that the gyroscope sensor may be self-oscillated.

As illustrated in FIG. 1, a process of processing a signal output from the gyroscope sensor includes amplifying, by a pre-amplifier 102, a signal output from a gyroscope sensor 101, demodulating, by a demodulator 103, the amplified signal, eliminating, by a low pass filter 104, a high frequency noise from the demodulated signal, and converting, by an analog/digital converter 105, the noise-removed signal (analog signal) into a digital data.

In a series of processes as described above, a quadrature error occurs due to a mismatch caused by an asymmetrical shape of the gyroscope sensor 101. When the gyroscope sensor is normally operated, the quadrature error is eliminated due to the demodulation process.

However, when the quadrature error is large, a signal is saturated as illustrated in FIG. 2. As a result, it may be difficult to detect the signal. Further, the quadrature error gives rise to noises (for example, jitter) in a system to hinder an accurate signal detection.

RELATED ART DOCUMENT

Patent Document (Patent Document 1) Korean Patent Laid-Open Publication No. 10-2006-0132686
(Patent Document 2) Japanese Patent Laid-Open Publication No. 2008-241330

SUMMARY OF THE INVENTION

An object of the present invention is to provide a self-oscillation circuit having a means for eliminating a quadrature error, which eliminates a quadrature error occurring signal due to a mismatch caused by an asymmetrical shape of a gyroscope sensor from an output signal from the gyroscope sensor to prevent a signal saturation occurring in a system and eliminate noises due to the quadrature error, and a method for eliminating a quadrature error using the circuit.

According to an exemplary embodiment of the present invention, there is provided a self-oscillation circuit having a means for eliminating a quadrature error, including: a gyroscope sensor receiving a driving signal to output a current signal; a sensor driver outputting a signal for driving the gyroscope sensor; a voltage converter converting a current signal from the gyroscope sensor into a voltage signal; a signal magnitude detector measuring a magnitude of a quadrature error signal included in an output signal from the voltage converter; a quadrature error eliminator generating a signal which has the same phase as the output signal from the voltage converter and the same magnitude as a signal measured by the signal magnitude detector, based on an output signal from the signal magnitude detector and the output signal from the voltage converter; a subtractor outputting a signal obtained by subtracting an output signal from the quadrature error eliminator from the output signal from the voltage converter; a phase converter converting a phase of the output signal from the voltage converter; and a demodulator performing a demodulation to an original signal output from the gyroscope sensor, based on the output signal from the phase converter and an output signal from the subtractor.

The voltage converter may include a signal detection unit detecting an output signal from the gyroscope sensor and a driving unit monitoring the output signal from the gyroscope sensor to output a signal for normally vibrating the gyroscope sensor.

A latter stage of the demodulator may be further provided with a high frequency noise elimination filter for eliminating a high frequency noise from an output signal from the demodulator.

The self-oscillation circuit having a means for eliminating a quadrature error may further include: an automatic gain controller receiving the output signal from the phase converter to control a gain of the output signal and providing the gain-controlled output signal to the sensor driver.

The self-oscillation circuit having a means for eliminating a quadrature error may further include: a memory storing data obtained by measuring the magnitude of the quadrature error by the signal magnitude detector prior to the operation of the gyroscope sensor when the magnitude of the quadrature error occurring from the gyroscope sensor is constant.

According to another exemplary embodiment of the present invention, there is provided a method for eliminating a quadrature error using a self-oscillation circuit having a means for eliminating a quadrature error, including: driving a gyroscope sensor by a sensor driver; resonating the gyroscope sensor by receiving a driving signal from the sensor driver to output a current signal; converting, by a voltage converter, the current signal from the gyroscope sensor into a voltage signal; measuring, by a signal magnitude detector, a magnitude of a quadrature error signal included in a voltage signal converted by the voltage converter; generating, by a quadrature error eliminator, a signal which has the same phase as the output signal from the voltage converter and the same magnitude as a signal measured by the signal magnitude detector, based on an output signal from the signal magnitude detector and the output signal from the voltage converter; outputting, by a subtractor, a signal obtained by subtracting an output signal from the quadrature error eliminator from the output signal from the voltage converter; converting and outputting, by a phase converter, a phase of the output signal from the voltage converter; and performing, by a demodulator, a demodulation to an original signal output from the gyroscope sensor based on the output signal from the phase converter and the output signal from the subtractor.

The method for eliminating a quadrature error using a self-oscillation circuit having a means for eliminating a quadrature error may further include: after the demodulation by the demodulator, eliminating, by a high frequency noise elimination filter, a high frequency noise from the output signal from the demodulator.

The method for eliminating a quadrature error using a self-oscillation circuit having a means for eliminating a quadrature error may further include: after the phase conversion by the phase converter, receiving, by an automatic gain controller, the output signal from the phase converter to control a gain the output signal and providing the gain-controlled output signal to the sensor driver.

The method for eliminating a quadrature error using a self-oscillation circuit having a means for eliminating a quadrature error may further include: measuring the magnitude of the quadrature error by the signal magnitude detector prior to the operation of the gyroscope sensor when the magnitude of the quadrature error occurring from the gyroscope sensor is constant and storing the measured data in a memory.

DESCRIPTION OF THE PREFERRED EMBODIMENTS

Terms and words used in the present specification and claims are not to be construed as a general or dictionary meaning, but are to be construed to meaning and concepts meeting the technical ideas of the present invention based on a principle that the inventors can appropriately define the concepts of terms in order to describe their own inventions in the best mode.

Throughout the present specification, unless explicitly described to the contrary, "comprising" any components will be understood to imply the inclusion of other elements rather than the exclusion of any other elements. A term "part", "module", "device", or the like, described in the specification means a unit of processing at least one function or operation and may be implemented by hardware or software or a combination of hardware and software.

Hereinafter, exemplary embodiments of the present invention will be described in detail with reference to the accompanying drawings.

Figure 1:
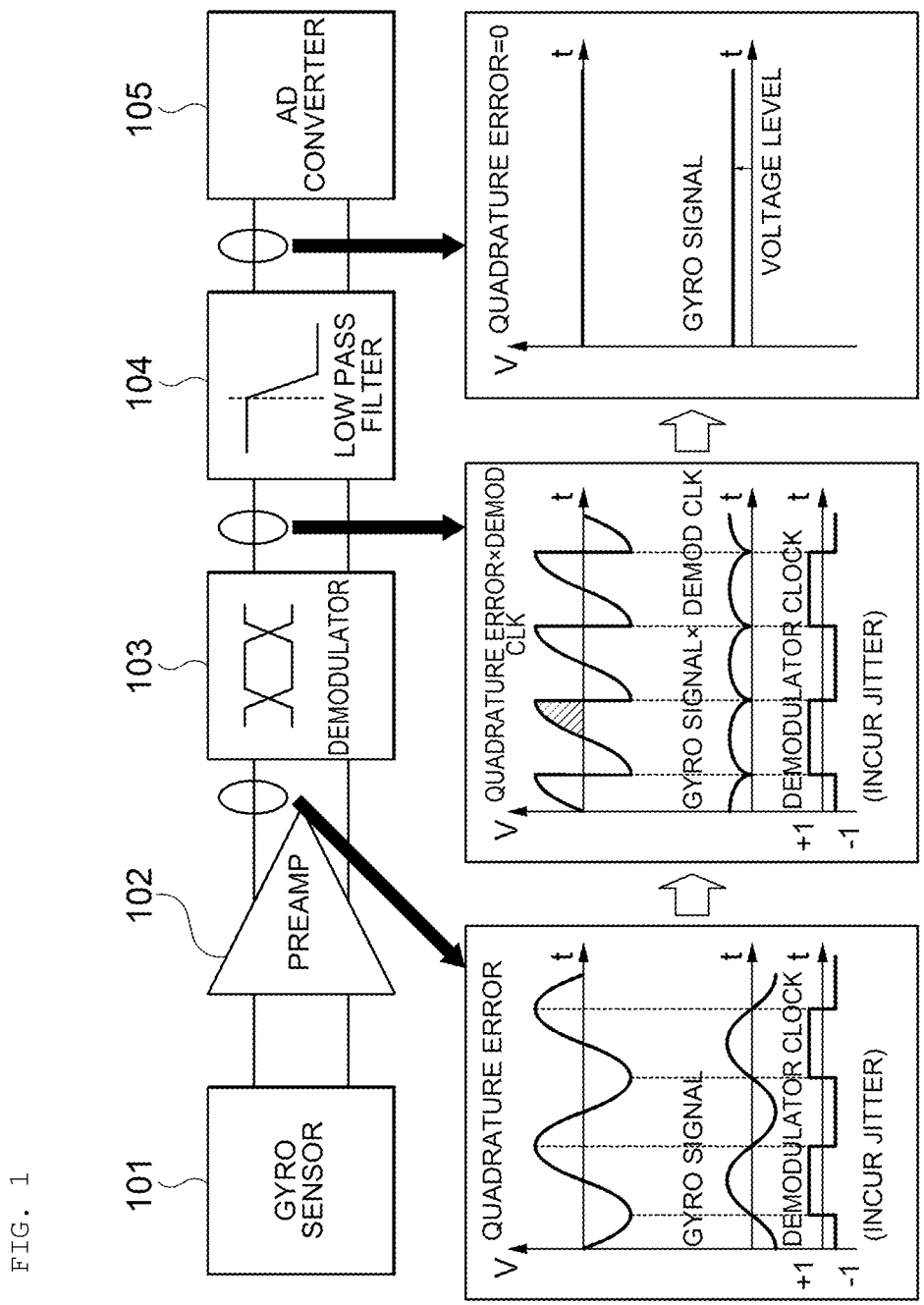
FIG. 1 is a diagram schematically illustrating a process of processing a signal output from a gyroscope sensor.
Figure 2:
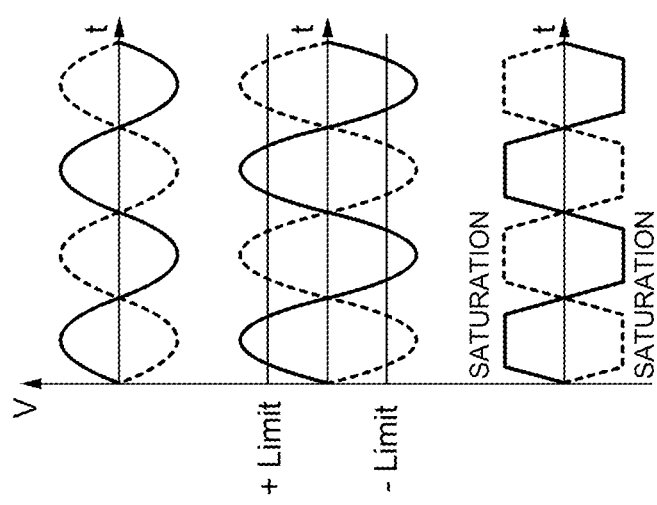
FIG. 2 is a diagram schematically illustrating a principle of saturating a signal when a magnitude of a quadrature error signal included in the output signal from the gyroscope sensor is large.
Figure 3:
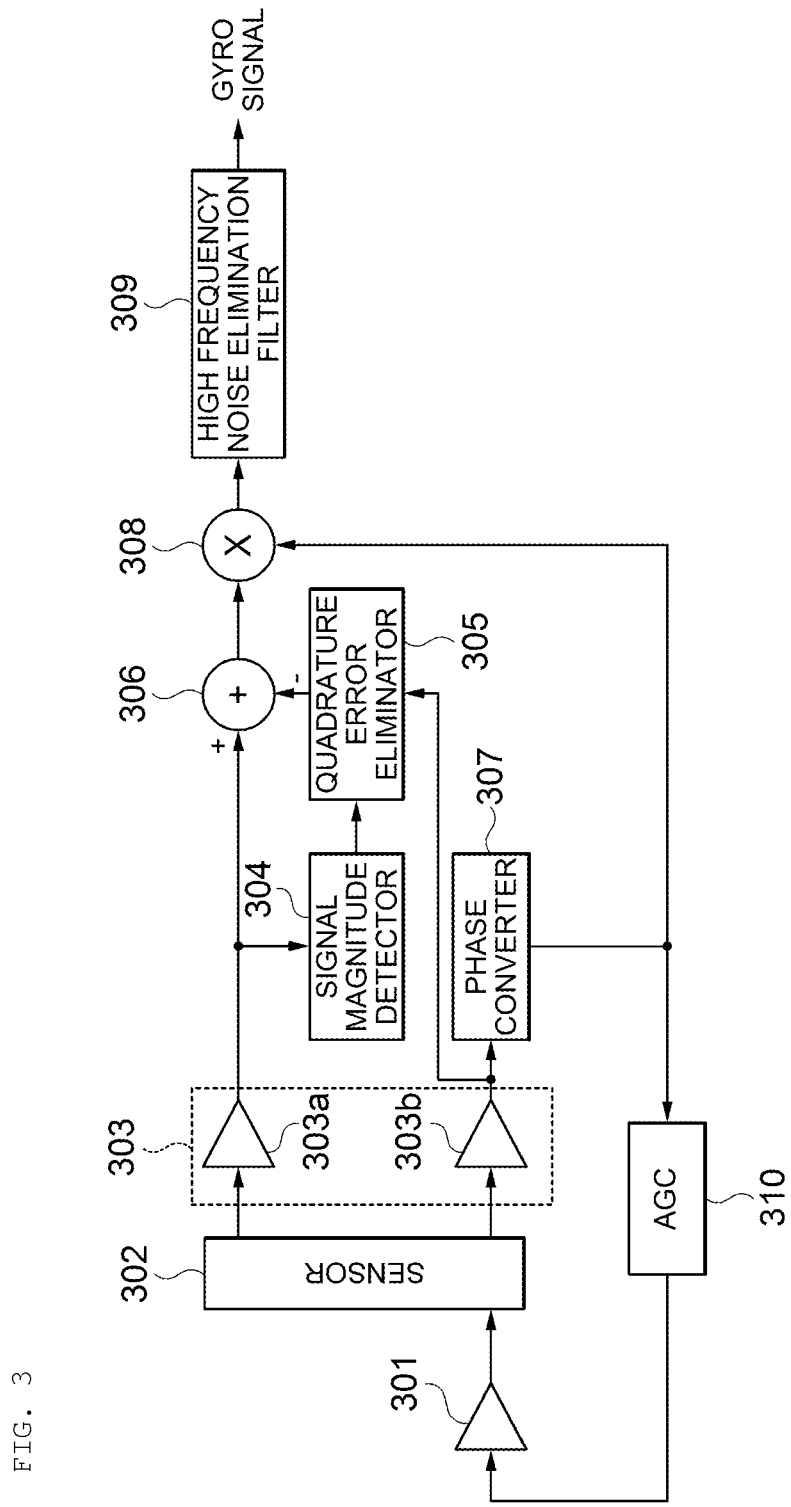
FIG. 3 is a diagram schematically illustrating a configuration of a self-oscillation circuit having a means for eliminating a quadrature error according to an exemplary embodiment of the present invention.

FIG. 3 is a diagram schematically illustrating a configuration of a self-oscillation circuit having a means for eliminating a quadrature error according to an exemplary embodiment of the present invention.

Referring to FIG. 3, the self-oscillation circuit having a means for eliminating a quadrature error according to the exemplary embodiment of the present invention may be configured to include a sensor driver 301, a gyroscope sensor 302, a voltage converter 303, a signal magnitude detector 304, a quadrature error eliminator 305, a subtractor 306, a phase converter 307, and a demodulator 308.

The sensor driver 301 outputs a driving signal for driving the gyroscope sensor 302.

The gyroscope sensor 302 is resonated by receiving the driving signal through an input terminal to output a current signal.

The voltage converter 303 receives the current signal from the gyroscope sensor 302 and converts the current signal into a voltage signal. In this case, the voltage converter 303 may be configured to include a signal detection unit 303a which detects a signal output from the gyroscope sensor 302 and a driving unit 303b which monitors the signal output from the gyroscope sensor 302 to output a driving signal allowing the gyroscope sensor 302 to normally vibrate.

The signal magnitude detector 304 measures a magnitude of the quadrature error included in the voltage signal converted by the voltage converter 303. That is, an output signal from the gyroscope sensor 302 may include a quadrature error signal in addition to the gyro signal, due to an asymmetrical shape of the gyro sensor 302. Therefore, according to the exemplary embodiment of the present invention, the magnitude of the quadrature error signal included in a signal output from the signal detection unit 303a of the voltage converter 303 is measured by the signal magnitude detector 304. In this case, comparing the magnitude of the quadrature error signal measured by the signal magnitude detector 304 with the magnitude of the gyro signal, the magnitude of the quadrature error signal is large enough to disregard the magnitude of the gyro signal. Therefore, the magnitude of the signal detected by the signal magnitude detector 304 is approximately equal to the magnitude of the quadrature error signal. Further, the quadrature error signal has a phase difference of 90° from the gyro signal and has the same phase as a driving signal output from the driving unit 303b of the voltage converter 303.

A quadrature error eliminator 305 receives an output signal from the signal magnitude detector 304 and an output signal from the voltage converter 303 (more accurately, the driving unit 303b of the voltage converter 303) and based on the received output signal, generates a signal which has the same phase as a signal output from the voltage converter 303, that is, the driving unit 303b of the voltage converter 303 and has the same magnitude as the magnitude of the signal (that is, quadrature error signal) measured by the signal magnitude detector 304.

The subtractor 306 receives the output signal from the voltage converter 303 (more accurately, the signal detecting unit 303a for the voltage converter 303) and the output signal from the quadrature error eliminator 305, respectively, to output a signal obtained by subtracting the output signal from the quadrature error eliminator 305 from the output signal from the voltage converter 303, that is, the signal detection unit 303a of the voltage converter 303. As described above, when the subtractor 306 subtracts the output signal from the quadrature error eliminator 305 from the output signal from the signal detection unit 303a of the voltage converter 303, the quadrature error signal included in the output signal from the signal detection unit 303a is eliminated, and thus only the gyro signal remains in the signal output from the subtractor 306.

The phase converter 307 receives the output signal from the voltage converter 303 (more accurately, the driving unit 303b of the voltage converter 303) to convert and output the phase of the output signal.

The demodulator 308 receives the output signal from the phase converter 307 and the output signal from the subtractor 306 and demodulates the received output signal to an original signal output from the gyroscope sensor 302, based on the output signals. In this case, as the demodulator 308, a multiplier may be used.

Preferably, a latter stage of the demodulator 308 may be further provided with a high frequency noise elimination filter 309 which eliminates a high frequency noise from the output signal from the demodulator 308. In this case, as the high frequency noise elimination filter 309, a low pass filter may be used.

Further, an automatic gain controller 310, which receives the output signal from the phase converter 307 to control the gain of the output signal and provides the gain-controlled output signal to the sensor driver 301, thereby controlling the driving signal output from the sensor driver 301 to be a constant magnitude at all times, may be further provided between the phase converter 307 and the sensor driver 301.

Figure 4:
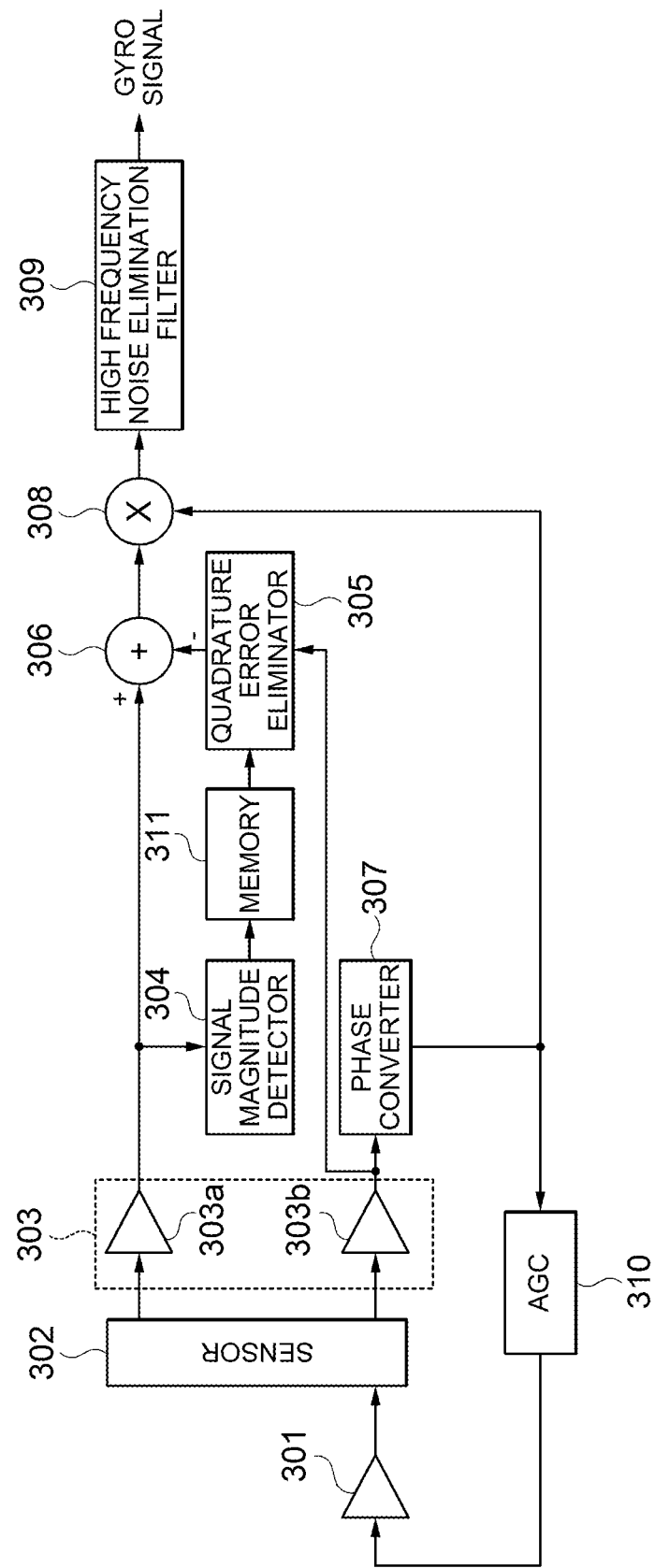
FIG. 4 is a diagram schematically illustrating a configuration of a self-oscillation circuit having a means for eliminating a quadrature error according to another exemplary embodiment of the present invention.

Preferably, as illustrated in FIG. 4, a memory 311, which stores obtained by measuring the magnitude of the quadrature error prior to the operation of the gyroscope sensor 302 when the magnitude of the quadrature error (signal) occurring from the gyroscope sensor 302 is constant, may be further provided between the signal magnitude detector 304 and the quadrature error eliminator 305. By doing so, it is possible to eliminate the effect of the quadrature error having a constant magnitude all the time.

Hereinafter, a method for eliminating a quadrature error using the self-oscillation circuit having the means for eliminating a quadrature error according to the exemplary embodiment of the present invention will be described.

Figure 5:
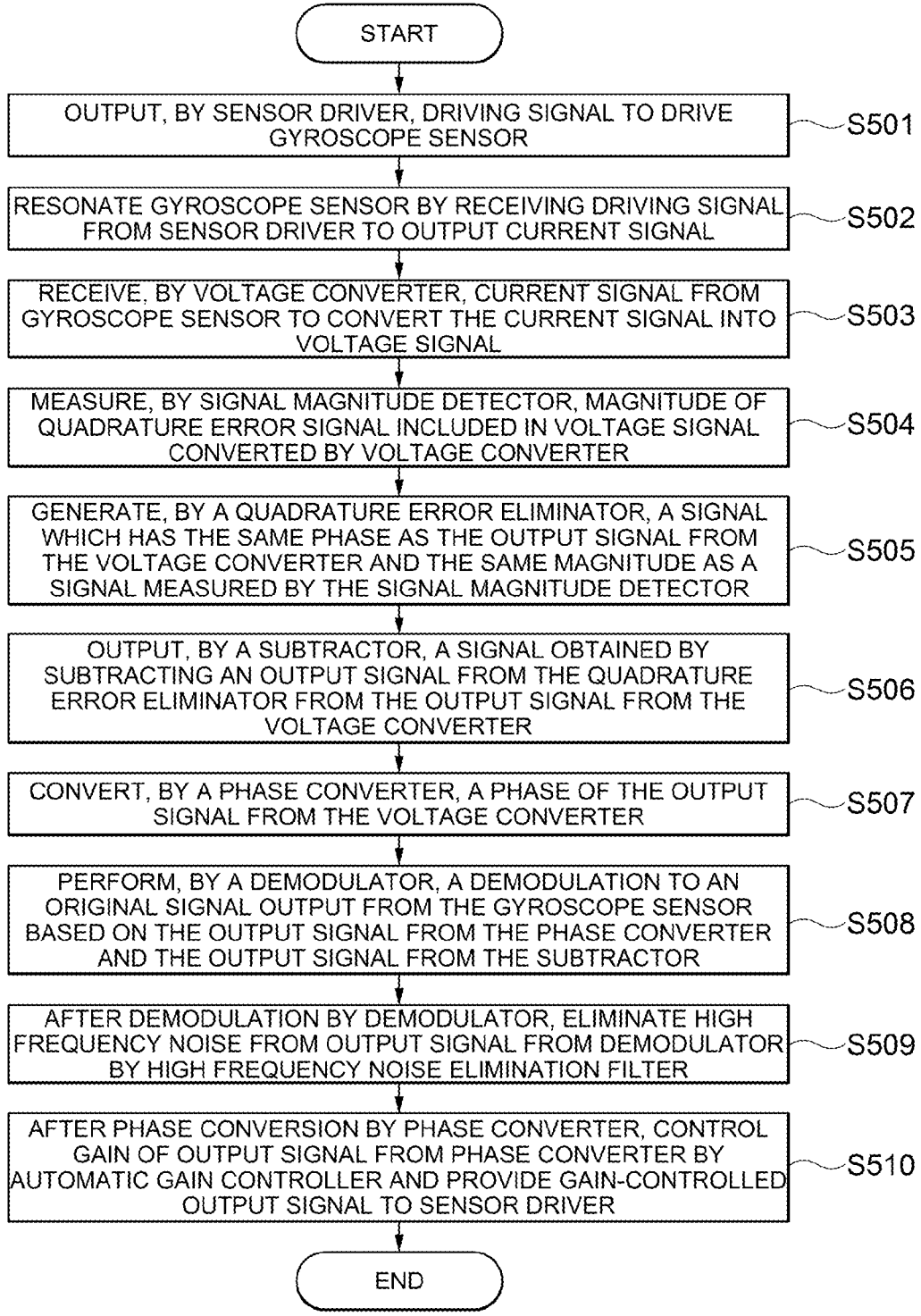
FIG. 5 is a flow chart illustrating a process of executing a method for eliminating a quadrature error according to an exemplary embodiment of the present invention.

FIG. 5 is a flow chart illustrating a process of executing a method for eliminating a quadrature error according to an exemplary embodiment of the present invention.

Referring to FIG. 5, as described above, the method for eliminating a quadrature error according to the exemplary embodiment of the present invention is a method for eliminating a quadrature error occurring in the gyroscope sensor 302 by using the self-oscillation circuit having the means for eliminating a quadrature error including the sensor driver 301, the gyroscope sensor 302, the voltage converter 303, the signal magnitude detector 304, the quadrature error eliminator 305, the subtractor 306, the phase converter 307, and the demodulator 308 and first outputs, by the sensor driver 301, the driving signal to drive the gyroscope sensor 302 (S501).

As described above, the gyroscope sensor 302 receiving the driving signal from the sensor driver 301 is resonated to output the current signal (S502).

By doing so, when the gyroscope sensor 302 is resonated to output the current signal, the voltage converter 303 receives the current signal and converts the received current signal into the voltage signal (S503). In this case, the signal detection unit 303a of the voltage converter 303 detects the signal output from the gyroscope sensor 302. Herein, the signal output from the gyroscope sensor 302 may include the quadrature error signal occurring due to the asymmetrical shape of the gyroscope sensor 302, in addition to the gyro signal. Further, the driving unit 303b of the voltage converter 303 monitors the signal output from the gyroscope sensor 302 to output the driving signal allowing the gyroscope sensor 302 to normally vibrate.

As described above, when the signal converted into the voltage by the voltage converter 303 is output, the signal magnitude detector 304 measures the magnitude of the quadrature error signal included in the voltage signal converted by the voltage converter 303 (S504). That is, the signal magnitude detector 304 receives the signal output from the signal detection unit 303a of the voltage converter 303 to measure the magnitude of the quadrature error signal included in the signal. In this case, comparing the magnitude of the quadrature error signal measured by the signal magnitude detector 304 with the magnitude of the gyro signal, the magnitude of the quadrature error signal is large enough to disregard the magnitude of the gyro signal. Therefore, the magnitude of the signal detected by the signal magnitude detector 304 is approximately equal to the magnitude of the quadrature error signal. Further, the quadrature error signal has a phase difference of 90° from the gyro signal and has the same phase as the driving signal output from the driving unit 303b of the voltage converter 303.

As described above, when the signal magnitude detector 304 measures and outputs the magnitude of the quadrature error signal, the quadrature error eliminator 305 receives the output signal from the signal magnitude detector 304 and the output signal from the voltage converter 303 (more accurately, the driving unit 303b of the voltage converter 303), respectively, and generates a signal which has the same phase as the signal output from the voltage converter (that is, the driving unit 303b of the voltage converter 303) and has the same magnitude as the magnitude of the signal (that is, quadrature error signal) measured by the signal magnitude detector 304, based on the received output signals (S505).

Next, the subtractor 306 receives the output signal from the voltage converter 303 (more accurately, the signal detecting unit 303a for the voltage converter 303) and the output signal from the quadrature error eliminator 305, respectively, to output the signal obtained by subtracting the output signal from the quadrature error eliminator 305 from the output signal from the voltage converter 303 (that is, the signal detection unit 303a of the voltage converter 303) (S506). As described above, when the subtractor 306 subtracts the output signal from the quadrature error eliminator 305 from the output signal from the signal detection unit 303a of the voltage converter 303, the quadrature error signal included in the output signal from the signal detection unit 303a is eliminated, and thus only the gyro signal remains in the signal output from the subtractor 306.

Meanwhile, the signal output from the driving unit 303b of the voltage converter 303 is provided to the quadrature error eliminator 305 and the phase converter 307, such that the phase converter 307 receives the output signal from the voltage converter 303 (that is, the driving unit 303b of the voltage converter 303) to convert and output the phase of the signal (S507).

As described above, when the phase converter 307 outputs the phase-converted signal and the subtractor 306 outputs a subtraction result signal, the demodulator 308 receives the output signal from the phase converter 307 and the output signal from the subtractor 306, respectively, and performs a demodulation to an original signal output from the gyroscope sensor 302, based on the output signals (S508). As described above, the process of executing the method for eliminating a quadrature error according to the exemplary embodiment of the present invention is substantially completed.

Preferably, however, the method for eliminating a quadrature error may further include eliminating a high frequency noise from the output signal from the demodulator 308 by the high frequency noise elimination filter 309 after the demodulator 308 performs the demodulation (S509).

Further, the method for eliminating a quadrature error may further include after the phase converter 307 performs the phase conversion, receiving, by the automatic gain controller 310, the output signal from the phase converter 307 to control the gain of the output signal from the phase converter 307 to be provided to the sensor driver 301 (S510). By doing so, the method for eliminating a quadrature error is to control the driving signal output from the sensor driver 301 to be a constant magnitude at all times.

Figure 6:
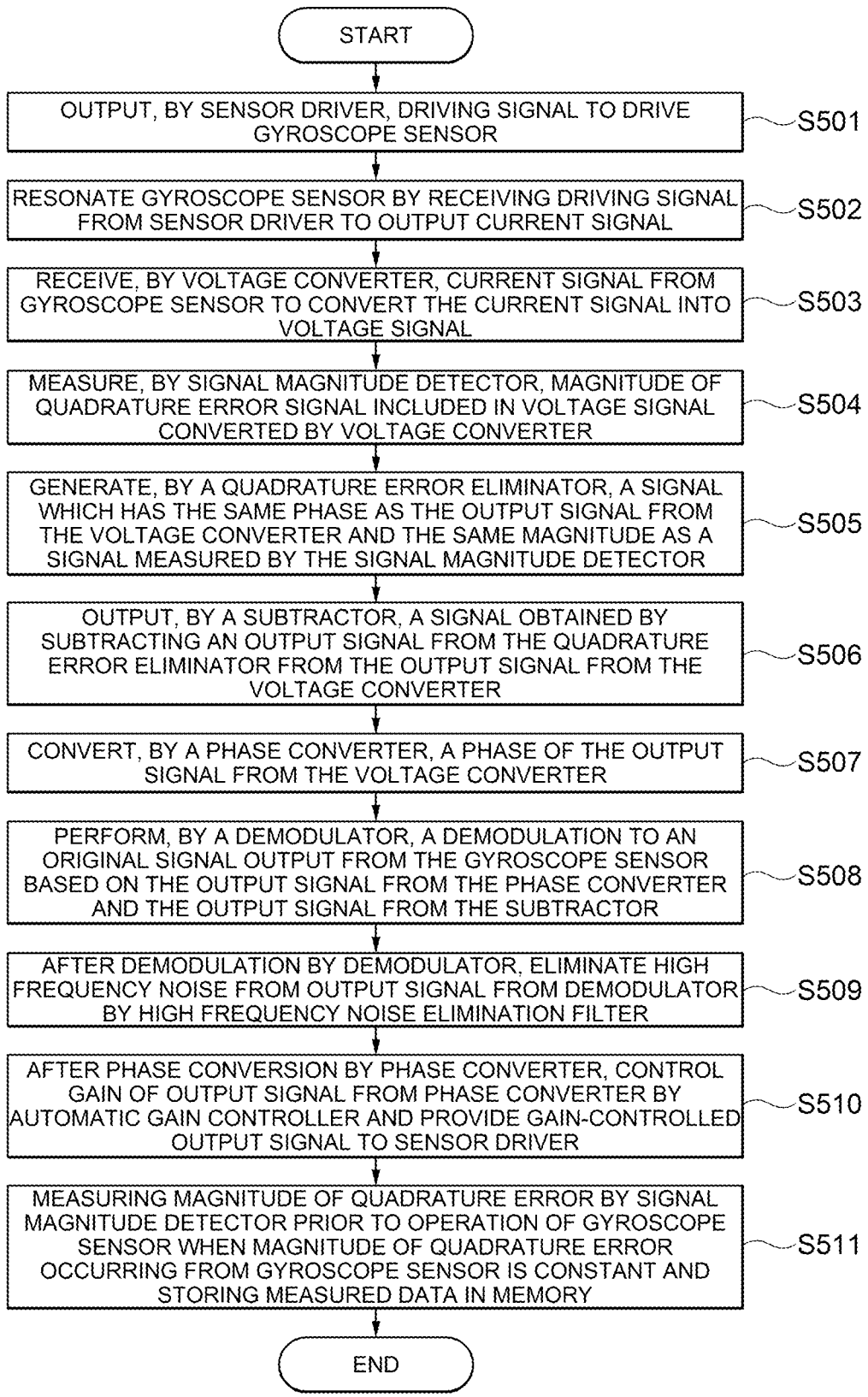
FIG. 6 is a flow chart illustrating a process of executing a method for eliminating a quadrature error according to another exemplary embodiment of the present invention.

Preferably, as illustrated in FIG. 6, when the magnitude of the quadrature error generated from the gyroscope sensor 302 is constant, the method for eliminating a quadrature error may further include measuring, by the signal magnitude detector 304, the magnitude of the quadrature error prior to the operation of the gyroscope sensor 302 and storing the measured data in the memory 311 (see FIG. 4) (S511). By doing so, the method for eliminating a quadrature error is to eliminate the effect of the quadrature error having a constant magnitude at all times.

As described above, the self-oscillation circuit having a means for eliminating a quadrature error according to the exemplary embodiment of the present invention uses the quadrature error eliminator and the subtractor to eliminate the quadrature error occurring due to the mismatch caused by the asymmetrical shape of the gyroscope sensor, thereby preventing the signal saturation in the system and effectively eliminating the noised due to the quadrature error.

As set forth above, according to the exemplar embodiments of the present invention, the quadrature error occurring due to the mismatch caused by the asymmetrical shape of the gyroscope sensor can be eliminated to prevent the signal saturation in the system and effectively eliminate the noises due to the quadrature error.

Although the exemplary embodiments of the present invention have been disclosed for illustrative purposes, the present invention is not limited thereto, but those skilled in the art will appreciate that various modifications, additions and substitutions are possible, without departing from the scope and spirit of the invention as disclosed in the accompanying claims. Therefore, the protection scope of the present invention must be analyzed by the appended claims and it should be analyzed that all spirits within a scope equivalent thereto are included in the appended claims of the present invention.

What is claimed is:

1. A self-oscillation circuit having a means for eliminating a quadrature error, comprising:
   a gyroscope sensor receiving a driving signal to output a current signal;
   a sensor driver outputting a signal for driving the gyroscope sensor;
   a voltage converter converting a current signal from the gyroscope sensor into a voltage signal;
   a signal magnitude detector measuring a magnitude of a quadrature error signal included in an output signal from the voltage converter;
   a quadrature error eliminator generating a signal which has the same phase as the output signal from the voltage converter and the same magnitude as a signal measured by the signal magnitude detector, based on an output signal from the signal magnitude detector and the output signal from the voltage converter;
   a subtractor outputting a signal obtained by subtracting an output signal from the quadrature error eliminator from the output signal from the voltage converter;
   a phase converter converting a phase of the output signal from the voltage converter; and
   a demodulator performing a demodulation to an original signal output from the gyroscope sensor, based on the output signal from the phase converter and an output signal from the subtractor.

2. The self-oscillation circuit according to claim 1, wherein the voltage converter includes a signal detection unit detecting an output signal from the gyroscope sensor and a driving unit monitoring the output signal from the gyroscope sensor to output a signal for normally vibrating the gyroscope sensor.

3. The self-oscillation circuit according to claim 1, wherein a latter stage of the demodulator is further provided with a high frequency noise elimination filter for eliminating a high frequency noise from an output signal from the demodulator.

4. The self-oscillation circuit according to claim 1, further comprising:
   an automatic gain controller receiving the output signal from the phase converter to control a gain of the output signal and providing the gain-controlled output signal to the sensor driver.

5. The self-oscillation circuit according to claim 1, further comprising:
   a memory storing data obtained by measuring the magnitude of the quadrature error by the signal magnitude detector prior to the operation of the gyroscope sensor when the magnitude of the quadrature error occurring from the gyroscope sensor is constant.

6. A method for eliminating a quadrature error using a self-oscillation circuit having a means for eliminating a quadrature error, comprising:
   driving a gyroscope sensor by a sensor driver;
   resonating the gyroscope sensor by receiving a driving signal from the sensor driver to output a current signal;
   converting, by a voltage converter, the current signal from the gyroscope sensor into a voltage signal;
   measuring, by a signal magnitude detector, a magnitude of a quadrature error signal included in a voltage signal converted by the voltage converter;
   generating, by a quadrature error eliminator, a signal which has the same phase as the output signal from the voltage converter and the same magnitude as a signal measured by the signal magnitude detector, based on an output signal from the signal magnitude detector and the output signal from the voltage converter;
   outputting, by a subtractor, a signal obtained by subtracting an output signal from the quadrature error eliminator from the output signal from the voltage converter;
   converting and outputting, by a phase converter, a phase of the output signal from the voltage converter; and performing, by a demodulator, a demodulation to an original signal output from the gyroscope sensor based on the output signal from the phase converter and the output signal from the subtractor.

7. The method according to claim 6, further comprising:
after the demodulation by the demodulator, eliminating, by a high frequency noise elimination filter, a high frequency noise from the output signal from the demodulator.

8. The method according to claim 6, further comprising:
after the phase conversion by the phase converter, receiving, by an automatic gain controller, the output signal from the phase converter to control a gain the output signal and providing the gain-controlled output signal to the sensor driver.

9. The method according to claim 6, further comprising:
measuring the magnitude of the quadrature error by the signal magnitude detector prior to the operation of the gyroscope sensor when the magnitude of the quadrature error occurring from the gyroscope sensor is constant and storing the measured data in a memory.

* * * * *